(12) United States Patent
Mack et al.

(10) Patent No.: US 7,603,497 B2
(45) Date of Patent: *Oct. 13, 2009

(54) METHOD AND APPARATUS TO LAUNCH WRITE QUEUE READ DATA IN A MICROPROCESSOR RECOVERY UNIT

(75) Inventors: Michael J. Mack, Round Rock, TX (US); Kenneth L. Ward, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/360,116

(22) Filed: Jan. 27, 2009

(65) Prior Publication Data

US 2009/0132854 A1 May 21, 2009

Related U.S. Application Data

(63) Continuation of application No. 11/165,484, filed on Jun. 23, 2005, now Pat. No. 7,526,583.

(51) Int. Cl.
*G06F 3/00* (2006.01)
*G06F 5/00* (2006.01)

(52) U.S. Cl. ......................... 710/54; 714/724
(58) Field of Classification Search .................. 710/54; 714/724

See application file for complete search history.

(56) References Cited

U.S. PATENT DOCUMENTS 4,823,259 A    4/1989   Aichelmann, Jr. et al.
5,432,918 A    7/1995   Stamm
6,088,740 A    7/2000   Ghaffari et al.
6,600,673 B1   7/2003   Croce
6,662,261 B2   12/2003  Duboc et al.
6,791,855 B2   9/2004   Batson et al.
6,886,048 B2   4/2005   Richard et al.
7,409,589 B2   8/2008   Mack et al.
2004/0243743 A1 12/2004 Smith
2006/0179207 A1 8/2006  Eisen et al.
2006/0179346 A1 8/2006  Bishop et al.
2007/0028078 A1 2/2007  Harris et al.

OTHER PUBLICATIONS

Tamir et al., "High-Performance Multi-Queue Buffers For Vlsi Communications Switches," IEEE (1988).
Chappell et al., "Microarchitectural Support For Precomputation Microthreads," IEEE (2002).
Buyuktosunoglu et al., "Tradeoffs In Power-Efficient Issue Queue Design," ISLPED (Aug. 2002).
Kucuk et al., "Reducing Reorder Buffer Complexity Through Selective Operand Caching," ISLPED, (Aug. 2003).

*Primary Examiner*—Eddie P Chan
*Assistant Examiner*—George D Giroux
(74) *Attorney, Agent, or Firm*—Diana R. Gerhardt; Jack V. Musgrove

(57) ABSTRACT

A method of checkpointing a microprocessor by providing, in parallel, a current read value from a queue and a next read value from the queue, and then selectively passing one of the current read value and next read value to a capture latch based on an instruction completion signal. The capture latch can directly drive the checkpoint register circuitry in the recovery unit of the microprocessor. If the queue is empty, a pair of multiplexers connected to the input of the register queue array are used to pass the input data value. The instruction completion signal may indicate whether all instructions in an instruction group have successfully completed.

12 Claims, 3 Drawing Sheets

METHOD AND APPARATUS TO LAUNCH WRITE QUEUE READ DATA IN A MICROPROCESSOR RECOVERY UNIT

CROSS-REFERENCE TO RELATED APPLICATION

This application is a continuation of U.S. patent application Ser. No. 11/165,484 filed Jun. 23, 2005 now U.S. Pat. No. 7,526,583.

BACKGROUND OF THE INVENTION

1. Field of the Invention

The present invention generally relates to computer systems, and more particularly to a method of operating a recovery unit in a microprocessor that uses checkpoint registers.

2. Description of the Related Art

High-performance computer systems use multiple processors to carry out the various program instructions embodied in computer programs such as software applications and operating systems. A typical multi-processor system 10 is shown in FIG. 1. Computer system 10 has one or more processing units arranged in one or more processor groups; in the depicted system, there are four processing units 12a, 12b, 12c and 12d in processor group 14. The processing units communicate with other components of system 10 via a system or fabric bus 16. Fabric bus 16 is connected to a system memory 20, and various peripheral devices 22. Service processors 18a, 18b are connected to processing units 12 via a JTAG interface or other external service port. A processor bridge 24 can optionally be used to interconnect additional processor groups. System 10 may also include firmware (not shown) which stores the system's basic input/output logic, and seeks out and loads an operating system from one of the peripherals whenever the computer system is first turned on (booted).

System memory 20 (random access memory or RAM) stores program instructions and operand data used by the processing units, in a volatile (temporary) state. Peripherals 22 may be connected to fabric bus 16 via, e.g., a peripheral component interconnect (PCI) local bus using a PCI host bridge. A PCI bridge provides a low latency path through which processing units 12a, 12b, 12c and 12d may access PCI devices mapped anywhere within bus memory or I/O address spaces. The PCI host bridge interconnecting peripherals 22 also provides a high bandwidth path to allow the PCI devices to access RAM 20. Such PCI devices may include a network adapter, a small computer system interface (SCSI) adapter providing interconnection to a permanent storage device (i.e., a hard disk), and an expansion bus bridge such as an industry standard architecture (ISA) expansion bus for connection to input/output (I/O) devices including a keyboard, a graphics adapter connected to a display device, and a graphical pointing device (mouse) for use with the display device.

In a symmetric multi-processor (SMP) computer, all of the processing units 12a, 12b, 12c and 12d are generally identical, that is, they all use a common set or subset of instructions and protocols to operate, and generally have the same architecture. As shown with processing unit 12a, each processing unit may include one or more processor cores 26a, 26b which carry out program instructions in order to operate the computer. An exemplary processor core includes the Power5™ processor marketed by International Business Machines Corp., which comprises a single integrated circuit superscalar microprocessor having various execution units (fixed-point units, floating-point units, and load/store units), registers, buffers, memories, and other functional units, which are all formed by integrated circuitry. The processor cores may operate according to reduced instruction set computing (RISC) techniques, and may employ both pipelining and out-of-order execution of instructions to further improve the performance of the superscalar architecture.

Each processor core 26a, 26b may include an on-board (L1) cache (typically separate instruction cache and data caches) implemented using high speed memory devices. Caches are commonly used to temporarily store values that might be repeatedly accessed by a processor, in order to speed up processing by avoiding the longer step of loading the values from system memory 20. A processing unit can include another cache, i.e., a second level (L2) cache 28 which, along with a memory controller 30, supports both of the L1 caches that are respectively part of cores 26a and 26b. Additional cache levels may be provided, such as an L3 cache 32 which is accessible via fabric bus 16. Each cache level, from highest (L1) to lowest (L3) can successively store more information, but at a longer access penalty. For example, the on-board L1 caches in the processor cores might have a storage capacity of 128 kilobytes of memory, L2 cache 28 might have a storage capacity of 512 kilobytes, and L3 cache 32 might have a storage capacity of 2 megabytes. To facilitate repair/replacement of defective processing unit components, each processing unit 12a, 12b, 12c, 12d may be constructed in the form of a replaceable circuit board or similar field replaceable unit (FRU), which can be easily swapped installed in or swapped out of system 10 in a modular fashion.

In a superscalar architecture, instructions may be completed in-order and out-of-order. In-order completion means no instruction can complete before all instructions dispatched ahead of it have been completed. Out-of-order completion means that an instruction is allowed to complete before all instructions ahead of it have been completed, as long as a predefined rules are satisfied. Within a pipeline superscalar processor, instructions are first fetched, decoded and then buffered. Instructions can be dispatched to execution units as resources and operands become available. Additionally, instructions can be fetched and dispatched speculatively based on predictions about branches taken. The result is a pool of instructions in varying stages of execution, none of which have completed by writing final results to the system memory hierarchy. As resources become available and branches are resolved, the instructions are retired in program order, thus preserving the appearance of a machine that executes the instructions in program order. Overall instruction throughput can be further improved by modifying the hardware within the processor, for example, by having multiple execution units in a single processor core.

Computer system 10 may also use a computing technique known as hardware multithreading to independently execute smaller sequences of instructions called threads or contexts. When a processor, for any of a number of reasons, stalls and cannot continue processing or executing one of these threads, the processor can switch to another thread. The term "multithreading" as used by those skilled in the art of computer processor architecture is not the same as the software use of the term in which one task is subdivided into multiple related threads. Software multithreading substantially involves the operating system which manipulates and saves data from registers to main memory and maintains the program order of related and dependent instructions before a thread switch can occur. Software multithreading does not require nor is it concerned with hardware multithreading and vice versa. Hardware multithreading manipulates hardware-architected registers, execution units and pipelined processors to maintain the state of one or more independently executing sets of instructions (threads) in the processor hardware. Hardware threads could be derived from, for example, different tasks in a multitasking system, different threads compiled from a software multithreading system, or from different I/O processors. In each example of hardware multithreading, more than one thread can be independently maintained in a processor's registers.

Anytime during operation of computer system 10, a bit in a given memory cell or processor register may contain an incorrect value due to a soft error such as stray radiation or electrostatic discharge. Different techniques are used to detect and correct such errors. Processor cores 26 include a recovery unit that saves a copy of the data of the architected registers in checkpoint arrays once instructions have passed the completion point. In the event that an error is detected in the data output, the architected register values are restored from the checkpoint.

Processor cores 26 dispatch program instructions in groups. In order for an entire group of instructions to be ready to checkpoint, all instructions in the group must have completed execution. Some instructions have fixed execution times, while others have variable execution times. Additionally, some instructions may complete out of order. To determine if instructions are ready to checkpoint, an instruction group identifier or tag is defined as one plus the instruction tag of the youngest instruction in the group (i.e., the group tag for the current group is the same as the instruction tag of the oldest instruction in the next group). A comparison may then be performed between the group tag of the currently dispatching instruction group and the tag for the next instruction to complete. If the current group tag is the same as the tag of the next instruction to complete, then all of the instructions in the current group have safely completed and the results from the registers can be checkpointed.

Data arrival at the recovery unit can present difficulties since the instruction group cannot be checkpointed until the data from all of the instructions have arrived, but the checkpointing of groups must keep pace with the dispatching of groups or else the performance of the processor can be severely degraded. In a pipelined microprocessor with a low number of gate delays per stage, the comparison between the group tag and the next-to-complete tag requires a majority of the cycle time, with extra status checks taking much of the remainder. This comparison result must be used to manage the data queues that hold the result data, and the decision must also be fed to the circuits that control the read and write pointers as well as other control circuits that are distributed throughout the recovery unit. However, circuit latencies leave insufficient time to perform a hold or advance the controls of the read points of the recovery unit queue and can delay the deallocation/release of resources within the recovery unit. It would, therefore, be desirable to devise an improved method of checkpointing data in a recovery unit which could reduce or minimize any backward pressure on the dispatch and execution pipelines and store queue release to L2 cache by allowing checkpointing of an instruction group to quickly occur once all necessary conditions are satisfied and reported to the recovery unit.

SUMMARY OF THE INVENTION

It is therefore one object of the present invention to provide an improved method of checkpointing registers in a recovery unit of a microprocessor.

It is another object of the present invention to provide such a method which carries out checkpointing without adding any extra stage of latency.

It is yet another object of the present invention to provide a queue structure for a recovery unit of a microprocessor which can quickly checkpoint data after instructions have been completed.

The foregoing objects are achieved in a method of checkpointing registers of a microprocessor, by storing register values (data or control signals) in a recovery unit queue having a plurality of entries, providing in parallel a current read value from a current read entry of the recovery unit queue and a next read value from a next read entry of the recovery unit queue, and selectively passing one of the current read value and next read value to a capture latch based on an instruction completion signal. The capture latch can directly drive the checkpoint register or checkpoint decision circuitry. To handle the case wherein the queue is empty, the current read value and next read value are respectively provided to inputs of bypass multiplexers having another set of inputs connected to the input of the recovery unit queue (from the microprocessor execution units). If the instructions have successfully completed, the next read value is output to the capture latch; otherwise, an output multiplexer selects the current read value for output to hold the recovery unit queue in its current state. The current read value can be provided by a first read-pointer multiplexer controlled by a current read pointer which has a plurality of inputs connected to respective entries of the queue, and the next read value can be provided by a second read-pointer multiplexer controlled by a next read pointer which also has a plurality of inputs connected to respective entries of the queue. This method and the queue circuit which carries it out allow the use of the capture latch without adding an extra stage of latency. Input data to the queue is available from the capture latch the next cycle after the data is input.

The above as well as additional objectives, features, and advantages of the present invention will become apparent in the following detailed written description.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED EMBODIMENT(S)

Figure 1:
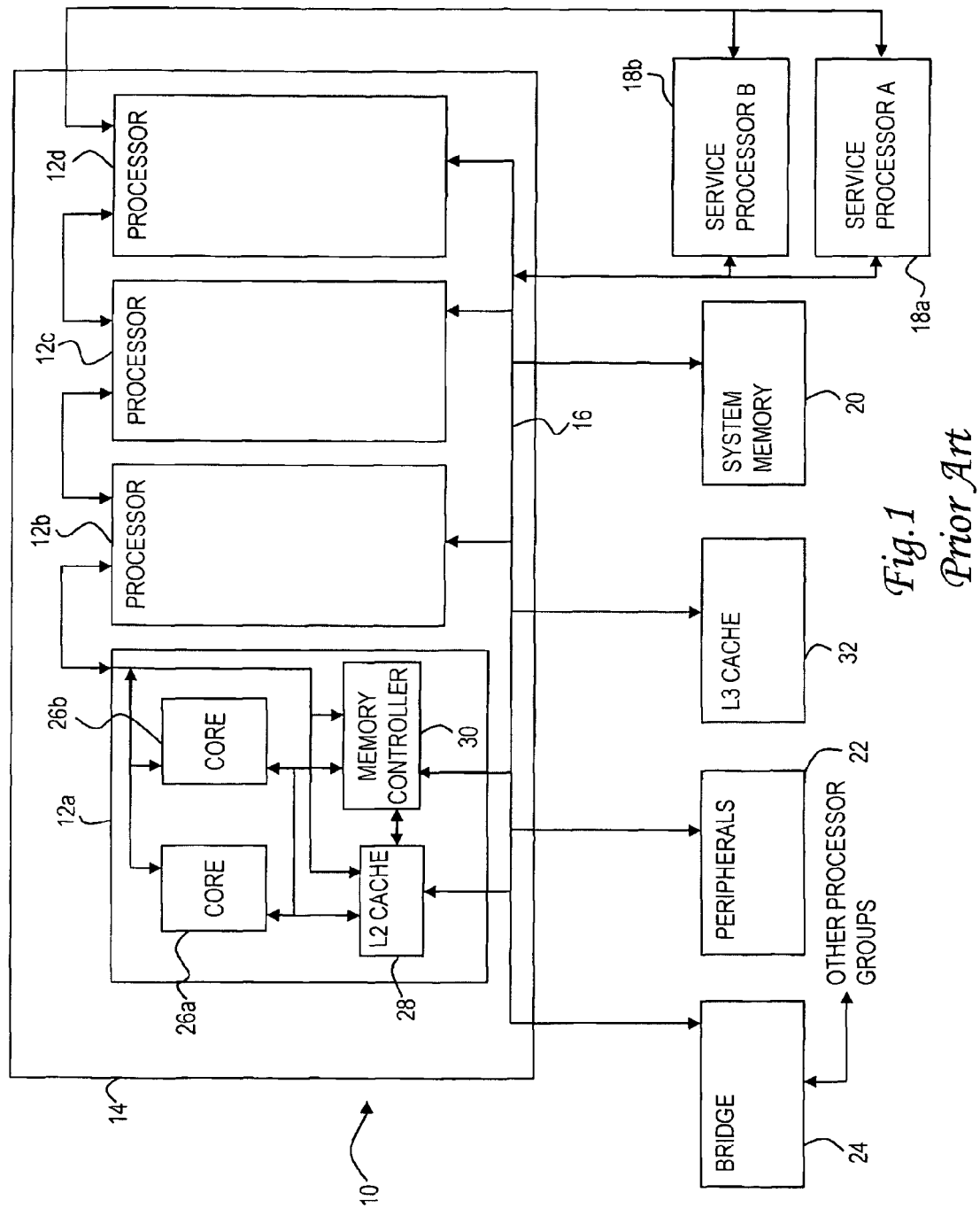
FIG. 1 is a block diagram of a conventional high-performance, multi-processor computer system.
Figure 2:
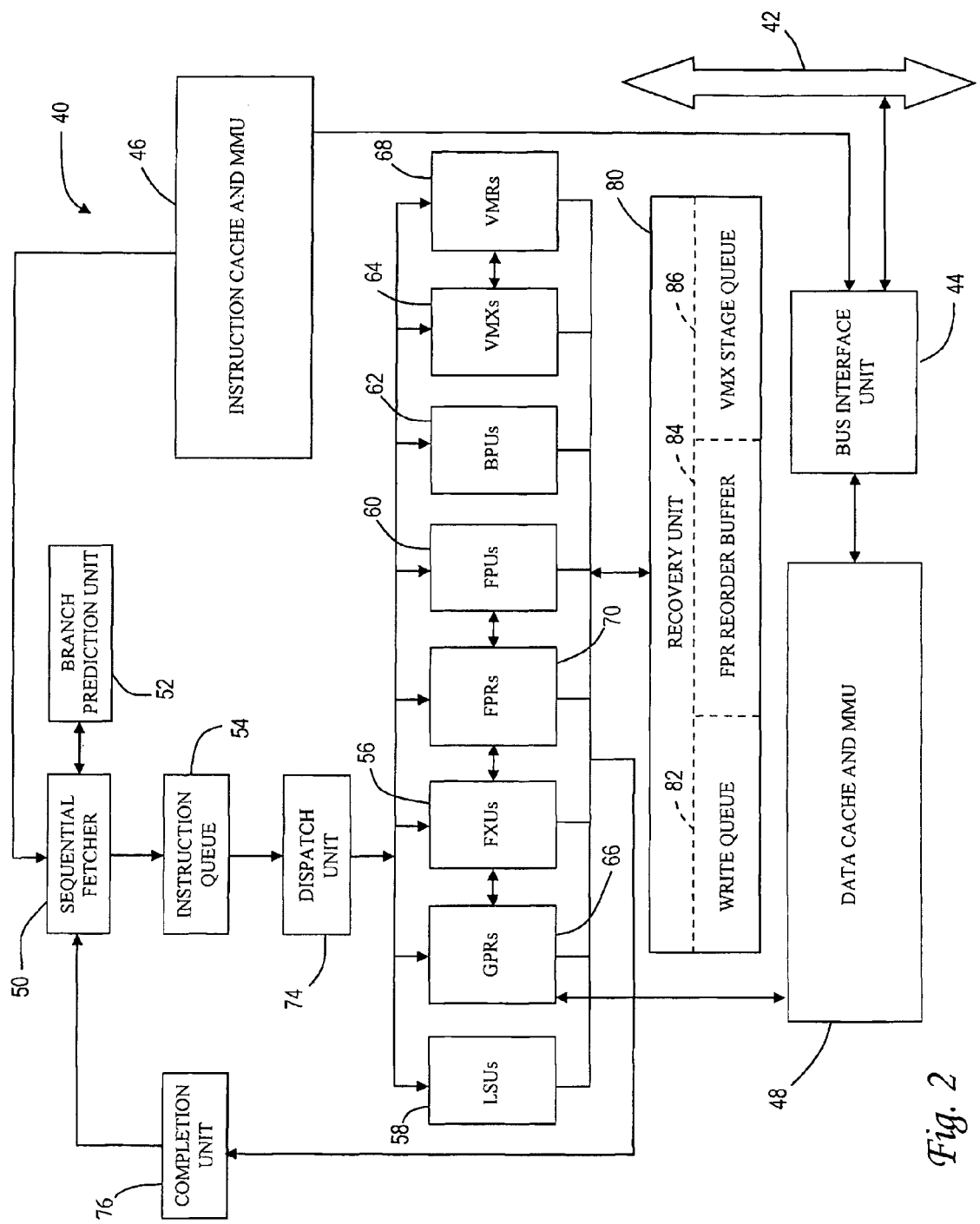
FIG. 2 is a block diagram of one embodiment of a processor core constructed in accordance with the present invention, having various execution units and registers, and a recovery unit that provides checkpointing of the registers.

With reference now to the figures, and in particular with reference to FIG. 2, there is depicted one embodiment 40 of a processor constructed in accordance with the present invention. Processor 40 is generally comprised of a single integrated circuit superscalar microprocessor, and includes various execution units, registers, buffers, memories, and other functional units which are all formed by integrated circuitry. Processor 40 may operate according to reduced instruction set computing (RISC) techniques, and is coupled to a system or fabric bus 42 via a bus interface unit (BIU) 44 within processor 40. BIU 44 controls the transfer of information between processor 40 and other devices coupled to system bus 42, such as a main memory, by participating in bus arbitration. Processor 40, system bus 42, and the other devices coupled to system bus 42 together form a host data processing system.

BIU 44 is connected to an instruction cache and memory management unit (MMU) 46, and to a data cache and MMU 48 within processor 40. High-speed caches, such as those within instruction cache and MMU 46 and data cache and MMU 48, enable processor 40 to achieve relatively fast access time to a subset of data or instructions previously transferred from main memory to the caches, thus improving the speed of operation of the host data processing system. Instruction cache and MMU 46 is further coupled to a sequential fetcher 50, which fetches instructions for execution from instruction cache and MMU 46 during each cycle. Sequential fetcher 50 transmits branch instructions fetched from instruction cache and MMU 46 to a branch prediction unit 52 for calculating the next instruction fetch address, but temporarily stores sequential instructions within an instruction queue 54 for execution by other execution circuitry within processor 40.

The execution circuitry of processor 40 has multiple execution units for executing sequential instructions, including one or more fixed-point units (FXUs) 56, load-store units (LSUs) 58, floating-point units (FPUs) 60, branch processing units (BPUs) 62, and vector multimedia extensions (VMXs) 64. These execution units 56, 58, 60, 62, and 64 execute one or more instructions of a particular type of sequential instructions during each processor cycle. For example, FXUs 56 perform fixed-point mathematical and logical operations such as addition, subtraction, shifts, rotates, and XORing, utilizing source operands received from specified general purpose registers (GPRs) 66. Following the execution of a fixed-point instruction, FXUs 56 output the data results of the instruction to selected GPRs 66. FPUs 60 perform single and double-precision floating-point arithmetic and logical operations, such as floating-point multiplication and division, on source operands received from floating-point registers (FPRs) 70. FPUs 60 output data resulting from the execution of floating-point instructions to selected FPRs 70. LSUs 58 execute floating-point and fixed-point instructions which either load data from memory (i.e., either the data cache within data cache and MMU 48 or main memory) into selected GPRs 66 or FPRs 70, or which store data from a selected one of GPRs 66 or FPRs 70 to system memory. BPUs 62 perform condition code manipulation instructions and branch instructions. VMXs 64 execute single instruction operations that act on multiple operand data to produce multiple results using vector computation, and output data resulting from the execution of vector instructions to selected vector multimedia registers (VMRs) 68.

Processor 40 may employ both pipelining and out-of-order execution of instructions to further improve the performance of its superscalar architecture, but the present invention is particularly advantageous when used with in-order program execution or in cases where out-of-order execution capabilities are limited. For out-of-order processing, instructions can be executed by FXUs 56, LSUs 58, FPUs 60, BPUs 62, and VMXs 64 in any order as long as data dependencies are observed. In addition, instructions may be processed by each of the FXUs 56, LSUs 58, FPUs 60, BPUs 62, and VMXs 64 as a sequence of pipeline stages, in particular, five distinct pipeline stages: fetch, decode/dispatch, execute, finish, and completion.

During the fetch stage, sequential fetcher 50 retrieves one or more instructions associated with one or more memory addresses from instruction cache and MMU 46. Sequential instructions fetched from instruction cache and MMU 46 are stored by sequential fetcher 50 within instruction queue 54. Sequential fetcher 40 folds out branch instructions from the instruction stream and forwards them to branch prediction unit 52 for handling. Branch prediction unit 52 includes a branch prediction mechanism, which may comprise a dynamic prediction mechanism such as a branch history table, that enables branch prediction unit 52 to speculatively execute unresolved conditional branch instructions by predicting whether or not the branch will be taken.

During the decode/dispatch stage, instruction dispatch unit (IDU) 74 decodes and dispatches one or more instructions from instruction queue 54 to execution units 56, 58, 60, 62, and 64. In addition, dispatch unit 74 allocates a register within GPRs 66, FPRs 70 or VMRs 68 for each dispatched instruction's result data. Upon dispatch, instructions are also stored within the multiple-slot completion buffer of completion unit 76 to await completion. Processor 40 tracks the program order of the dispatched instructions during out-of-order execution utilizing unique instruction identifiers.

During the execute stage, execution units 56, 58, 60, 62, and 64, execute instructions received from dispatch unit 74 opportunistically as operands and execution resources for the indicated operations become available. Each of execution units 56, 58, 60, 62, and 64, are preferably equipped with a reservation station that stores instructions dispatched to that execution unit until operands or execution resources become available. Then, execution units 56, 58, 60, 62, and 64, notify completion unit 76 which instructions have finished execution. Finally, instructions are completed in program order out of the completion buffer of completion unit 76. Instructions executed by FXUs 56, FPUs 60, and VMXs 64 are completed by transferring data results of the instructions from the execution units to GPRs 66, FPRs 70, and VMRs 68. Load and store instructions executed by LSUs 58 are completed by transferring the finished instructions to a completed store queue or a completed load queue from which the indicated load/store operations will be performed.

The execution units may utilize additional registers, for example, special purpose registers. The various registers and execution units of processor 40 may be duplicated to allow processing of multiple threads in the single processor core.

Processor 40 also includes a recovery unit 80 that saves a copy of the data from the architected registers 66, 68, 70 and other control registers in checkpoint arrays once instructions have passed the completion point without any error being detected. Errors arising during execution of instructions may be detected using parity checking at the output of the execution units. If an error is detected for any instruction in the group, the architected register values are restored from the checkpoints. The checkpoint thus contains the state of the machine with no errors.

In order to reduce the cost of tracking speculative instruction results, recovery unit 80 tracks instructions by dispatch group, i.e. instructions may be dispatched in program order to multiple execution units in any given processor cycle, and all instructions dispatched in the same cycle will be tracked and checkpointed together. Thus, the FXU, FPU and VMX instructions of the same dispatch group will be checkpointed together. An instruction group is only checkpointed when all instructions in that group have passed the completion point. The processor can partially checkpoint each dispatch group since instructions in the dispatch group such as branch instructions, load/store instructions, or other exception-causing instructions can cause the group to be partially flushed out, due to speculative execution.

Since FXU instructions and FPU or VMX instructions are executed out-of-order with respect to each other, with the FPU and VMX instructions taking longer to execute than the fixed point instructions, the FXU instructions may finish before the FPU or VMX instructions. Thus the fixed point data must wait at the recovery unit for the FPU or VMX instructions in the same dispatched group to be completed before the whole dispatch group can be checkpointed. Accordingly, in this embodiment, recovery unit 80 uses three queue structures for separately holding data from FXU, FPU and VMX instructions. These three queue structures are write queue 82, floating-point register (FPR) reorder buffer 84, and stage queue 86.

At dispatch time, a group tag (Gtag) is derived from the instruction tag (Itag) of the youngest instruction in the group by adding 1 to that Itag, to denote the age of the group relative to each instruction tag. The decision as to whether or not the instructions are ready to checkpoint is made by comparing the Gtag to the Itag for the next-to-complete (NTC) instruction. A group can be checkpointed when the NTC Itag is equal to or greater than the Gtag. The group can only be checkpointed when all FPU or VMX data for that group is available. When a group is partially flushed due to branch misprediction, load/store reject, or exception-causing instruction, a new Gtag is recalculated and saved by the recovery unit. This information is used to allow the recovery unit to partially checkpoint the original dispatch group while discarding data of the flushed instructions. When instructions are ready to checkpoint, entries in the queue structures are deallocated, store operations to the L2 cache are released, completion table entries are released, and interlocked floating-point instructions are released.

Some instructions modify system coherency resources prior to being finished. The PowerPC™ instruction store conditional (STCX) conditionally sets a lock, but the instruction cannot finish, or hence checkpoint, until the condition code is returned which indicates whether the lock was set or not. Some cache-inhibited (CI) load instructions automatically increment queue pointers in I/O devices, but cannot finish (and hence checkpoint) until the load data is returned and written to the target register. Normally a reported error blocks the checkpoint, working copies of registers are restored from the checkpointed copies, and processing resumes from the prior checkpoint. However, since these STCX/CT-load type instructions modify system coherent state prior to finishing/checkpointing, they may not be retried after an error if already started prior to the error.

Further details of recovery unit 80 may be found in U.S. patent application Ser. No. 11/140,648, filed May 27, 2005, and entitled "METHOD AND APPARATUS FOR REDUCING NUMBER OF CYCLES REQUIRED TO CHECKPOINT INSTRUCTIONS IN A MULTI-THREADED PROCESSOR," which is hereby incorporated.

The comparison of the Gtag to the NTC Itag is used to manage the queue structures that hold the result data. The result of the comparison is fed to the circuits that control the read and write pointers of those queues, as well as other control circuits that are distributed throughout the recovery unit. The read pointers of the queues are advanced or held based on the result of the comparison. The decision time for this comparison and the fan-out of the signal to all control points can take up most or all of the allotted cycle time. Although a latch could be used to perform the hold or advance the controls of the read pointers of the queue, such a construction might delay by one cycle the deallocation of entries in the recovery unit's queues, releasing of stores to the L2 cache, releasing of completion table entries, and releasing of interlocked floating-point instructions, which would severely degrade processor performance. The present invention uses a novel queue structure to eliminate any such added delay in recovery unit 80.

Figure 3:
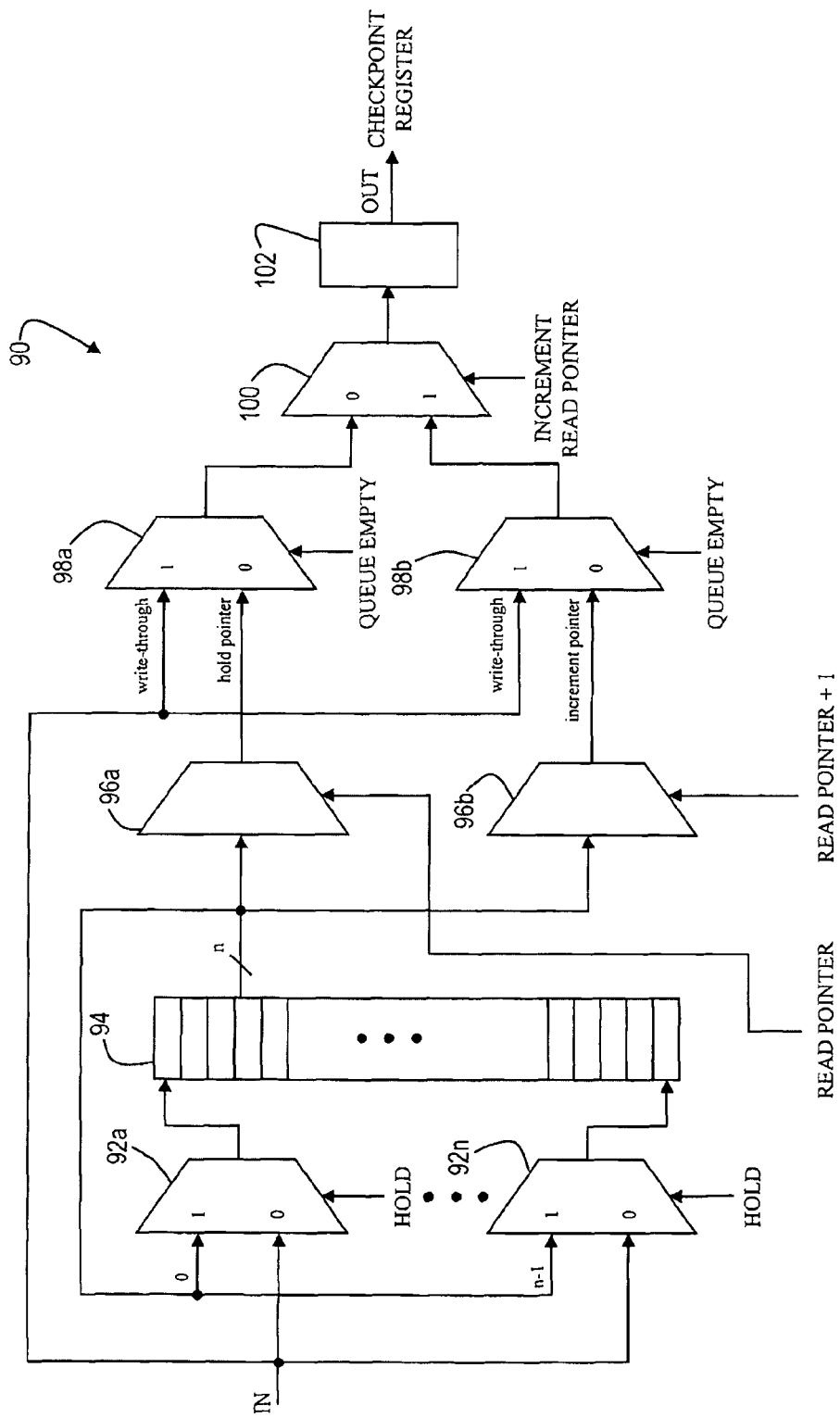
FIG. 3 is a high-level schematic diagram of one embodiment of a queue structure constructed in accordance with the present invention for use with the recovery unit of FIG. 2.

FIG. 3 illustrates one embodiment of such a write queue circuit 90 which may be used by FPR reorder buffer 84. Write queue circuit 90 includes a series of input multiplexers 92a-92n, an N-deep register array 94, a pair of read-pointer multiplexers 96a, 96b, a pair of queue-empty multiplexers 98a, 98b, an output multiplexer 100, and a capture latch 102. Register array 94 acts as a queue to hold N data and/or control signals until the checkpoint occurs. The values contained within register array 94 may be operand data values or related values such as parity check bits which are stored in the checkpoint registers, and may also be control signals that are used by the checkpoint decision circuitry. N is the number of entries in the queue; an exemplary number is 8 entries. Each input of register array 94 receives a respective output of an input multiplexer 92a-92n. Each input multiplexer 92a-92n has a respective input that feeds back a current array value from the output of register array 94, and another input that receives the data IN signal from the architected registers. The write pointer for write queue circuit 90 is decoded to write input data to only one of the multiplexers 92a-92n in a given cycle and hold the others, e.g., if the write pointer is currently pointing to the first queue entry it will set the select for multiplexer 92a to zero and set the selects for all other multiplexers 92b-92n to one. In this manner, the data or control value which is to be written that cycle will pass to the corresponding entry in register array 94 while all of the remaining register array entries will be held, i.e., reloaded with their current value.

Multiplexers 96a, 96b are N-to-1 multiplexers whose inputs receive the output (N bits wide) of register array 94 in parallel. Two read pointers are maintained for write queue circuit 90 by recovery unit 80: one pointing to the current read position, and the other pointing to the next read position which is equal to the current read pointer plus 1. The current read pointer controls the selection of multiplexer 96a, and the next read pointer controls the selection of multiplexer 96b. Therefore, the outputs of multiplexer 96a and 96b are the queue entries from a current read pointer position (the hold pointer) and a next read pointer position (the increment pointer), respectively.

One of the two outputs of multiplexers 96a, 96b could be selected to feed the checkpoint register but another multiplexer level is introduced to the two signal paths to handle the case wherein the write queue is empty, which allows capture latch 102 to drive the checkpoint registers or checkpoint decision circuitry in the cycle after incoming data is available. The output of multiplexer 96a is connected to an input of multiplexer 98a, and the output of multiplexer 96b is connected to an input of multiplexer 98b. The other inputs of multiplexers 98a, 98b are connected to the data IN signal from the architected registers. The write queue is considered empty when the write queue write pointer equals the current read pointer (for the current read pointer multiplexer 98a) or equals the next read pointer (for the next read pointer multiplexer 98b), in which case the queue empty signal turns on both multiplexers 98a, 98b to pass the current input value.

Multiplexer 100 is then used to select between the outputs of multiplexers 98a, 98b, and is controlled by the increment read pointer signal. If all instructions in the group have successfully completed and the data is ready to be checkpointed, then the increment read pointer signal becomes active and capture latch 102 receives the value for the next queue entry to be checkpointed. If an error occurred and it is necessary to place the queue state in a hold, then the increment read pointer signal is off and capture latch 102 receives the old value for the current queue entry. The OUT signal from capture latch 102 directly drives the checkpoint register circuitry. After a successful checkpoint, logic in recovery unit 80 increments the write and read pointers of write queue circuit 90.

Write queue circuit 90 handles a single bit of register data for each of the 8 queue entries. In the exemplary embodiment wherein each data or control value is 12 bits, FPR reorder buffer 84 uses 12 separate write queue circuits 90 in parallel to feed the checkpoint registers or checkpoint decision circuitry. If processor 40 has duplicate execution units and registers for hardware multithreading, then duplicate queue structures may be used to independently checkpoint the register sets.

Write queue circuit 90 allows the use of the capture latch without adding an extra stage of latency. This novel design provides the capability to write incoming data in one cycle and make it available to drive the checkpoint register inputs on the next cycle.

Although the invention has been described with reference to specific embodiments, this description is not meant to be construed in a limiting sense. Various modifications of the disclosed embodiments, as well as alternative embodiments of the invention, will become apparent to persons skilled in the art upon reference to the description of the invention. For example, while write queue circuit 90 is used in write queue 82, other variations of this queue design could be implemented for the other queue structures of recovery unit 80. It is therefore contemplated that such modifications can be made without departing from the spirit or scope of the present invention as defined in the appended claims.

What is claimed is:

1. A queue circuit for a recovery unit, comprising:
   a register having N number of entries with N corresponding outputs;
   a first signal path for a current read value corresponding to a current read entry of said register, said first signal path including a first N-to-1 multiplexer having inputs respectively connected to said outputs of said register, wherein the current read entry is output from said first N-to-1 multiplexer responsive to a first select signal pointing to a current read position;
   a second signal path for a next read value corresponding to a next read entry of said register, said second signal path including a second N-to-1 multiplexer which is separate from said first N-to-1 multiplexer, having inputs respectively connected to said outputs of said register, wherein the next read entry is output from said second N-to-1 multiplexer responsive to a second select signal pointing to a next read position;
   a capture latch; and
   a 2-to-1 output multiplexer separate from said first and second N-to-1 multiplexers which receives inputs from the first signal path and the second signal path in parallel and selectively passes one of the current read value and next read value to said capture latch based on an instruction completion signal.

2. The queue circuit of claim 1 wherein the current read value is provided to a first input of a second 2-to-1 multiplexer and the next read value is provided to a first input of a third 2-to-1 multiplexer, said second and third 2-to-1 multiplexers having second inputs connected to an input of said register, to bypass said register when said register is empty.

3. The queue circuit of claim 1 wherein said capture latch directly drives checkpoint register circuitry of the recovery unit.

4. The queue circuit of claim 1 wherein the instruction completion signal indicates whether a plurality of instructions dispatched as a group have all successfully completed.

5. The queue circuit of claim 1 wherein said output multiplexer passes the current read value when the instruction completion signal indicates that a program instruction associated with the next read value has not yet completed.

6. The queue circuit of claim 1 wherein said output multiplexer passes the next read value when the instruction completion signal indicates that a program instruction associated with the next read value has successfully completed.

7. A processor comprising:
   architected registers for storing data and control values;
   one or more execution units which use said architected registers to carry out program instructions;
   a dispatch unit which dispatches program instructions to said one or more execution units; and
   a recovery unit having checkpoint register circuitry and a queue circuit, said queue circuit having
       a register with N number of entries and N corresponding outputs,
       first and second signal paths wherein a current read value corresponding to a current read entry of said register is transmitted along said first signal path and a next read value corresponding to a next read entry of said register is transmitted along said second signal path in parallel with the current read value, said first signal path including a first N-to-1 multiplexer having inputs respectively connected to said outputs of said register wherein the current read entry is output from said first N-to-1 multiplexer responsive to a first select signal pointing to a current read position, and said second signal path including a second N-to-1 multiplexer separate from said first N-to-1 multiplexer having inputs respectively connected to said outputs of said register wherein the next read entry is output from said second N-to-1 multiplexer responsive to a second select signal pointing to a next read position, and
       means for selectively passing one of the current read value and next read value to said checkpoint register circuitry based on an instruction completion signal, said passing means including a capture latch and a 2-to-1 output multiplexer separate from said first and second N-to-1 multiplexers having inputs connected to the first signal path and the second signal path and having an output connected to said capture latch.

8. The processor of claim 7 wherein the current read value is provided to a first input of a second 2-to-1 multiplexer and the next read value is provided to a first input of a third 2-to-1 multiplexer, said second and third 2-to-1 multiplexers having second inputs connected to an input of said register, to bypass said register when said register is empty.

9. The processor of claim 7 wherein said capture latch directly drives said checkpoint register circuitry.

10. The processor of claim 7 wherein the instruction completion signal indicates whether a plurality of instructions dispatched as a group by said dispatch unit have all successfully completed.

11. The processor of claim 7 wherein said passing means passes the current read value when the instruction completion signal indicates that a program instruction associated with the next read value has not yet completed.

12. The processor of claim 7 wherein said passing means passes the next read value when the instruction completion signal indicates that a program instruction associated with the next read value has successfully completed.

* * * * *